United States Patent [19]
Lee

[11] Patent Number: 4,888,785
[45] Date of Patent: Dec. 19, 1989

[54] MINIATURE INTEGRATED OPTICAL BEAM SPLITTER

[75] Inventor: Tien-Pei Lee, Holmdel, N.J.

[73] Assignee: Bell Communications Research, Inc., Livingston, N.J.

[21] Appl. No.: 146,217

[22] Filed: Jan. 19, 1988

[51] Int. Cl.[4] .......................... H01S 3/19; G02B 6/10
[52] U.S. Cl. .................................. 372/50; 350/96.11; 350/96.12; 350/96.15
[58] Field of Search ............................ 372/50, 46, 45; 350/96.11, 96.12, 96.15

[56] References Cited

U.S. PATENT DOCUMENTS 4,669,817  6/1987  Mori ................................. 350/96.15

OTHER PUBLICATIONS

Osinski et al., "Miniature Integrated Optical Beam-Splitter in AlGaAs/GaAs Ridge Waveguides", Electronic Letter, Oct. 8, 1987, vol. 23, No. 21, pp. 1156–1158.

P. Buchmann et al., "Totally Reflective Mirrors: Fabrication and Application in GaAs Rib Waveguide Devices", Proc., 3rd European Conf., ECIO (1985).

Coldren et al., "Monolithic Two-Section GaInAsP-/InP Active-Optical Resonator Devices Formed by Reactive-Ion-Etching", Appl. Phys. Lett., 1981, 38, pp. 315–317.

Osinski et al., "Miniature Integrated-Optic Beam Splitter in AlGaAs/GaAs Ridge Waveguides", Proc. OFC-/IOOC, '87, TUK5, Jan. 1987.

*Primary Examiner*—William L. Sikes
*Assistant Examiner*—Georgia Y. Epps
*Attorney, Agent, or Firm*—James W. Falk

[57] ABSTRACT

A miniature integrated optical beam splitter comprises a pair of perpendicular intersecting ridge waveguides and a groove extending at an angle of 45° across the intersection of the waveguides, the depth of the groove extending below the ridge and into the waveguide layer to obtain the desired percentage of beam splitting.

4 Claims, 2 Drawing Sheets

4,888,785

MINIATURE INTEGRATED OPTICAL BEAM SPLITTER

FIELD OF THE INVENTION

This invention relates to optical waveguides in an integrated optical circuit particularly suitable as an optical beam splitter.

BACKGROUND OF THE INVENTION

In opto-electronic integrated circuits for communication and optical signal processing applications, it is desirable to have beam splitters or directional couplers in semiconductors to combine or split the optical signal. The two common approaches for implementing this are by the use of dual-channel waveguide couplers and by the use of Y-couplers. These techniques, however, usually require 0.5 to 1 cm device lengths which is prohibitively large for opto-electronic integration on a monolithic semiconductor integrated circuit chip.

Recently, P. Buchmann et al, *Proc. 3rd European conf., ECIO*, 1985, have reported totally reflecting waveguide mirrors in single-mode n/n+GaAs rib waveguides to change the light propagation direction by 90°. They have indicated small size and low insertion loss in these devices.

SUMMARY OF THE INVENTION

An optical ridge-waveguide beam splitter suitable for monolithic integration with semiconductor photonic and electronic devices in accordance with this invention comprises a pair of intersecting orthogonal ridge waveguides on a substrate, each waveguide having a lower guiding layer and an upper ridge layer, a narrow groove extending through the ridge layer and partially into said guiding layer extends at an angle to the orthogonal waveguide across the intersection of said waveguides, the walls of said groove being smooth and having a mirror-like surface. The thickness and width of the novel waveguide is typically in the order of microns.

DETAILED DESCRIPTION

Figure 1:
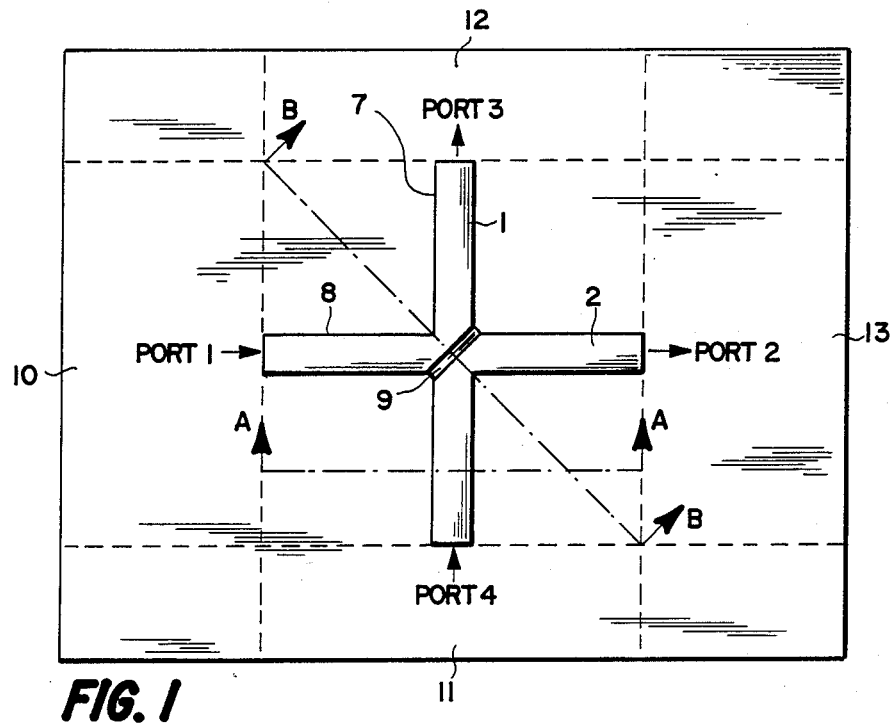
FIG. 1 is a top elevational view of a ridge waveguide beam splitter integrated in a monolithic structure with a semiconductor laser and a detector in accordance with the invention.

Generally, the waveguide beam splitter in accordance with the present invention comprises semiconductor layers having dimensions of thickness and width in the micron range, allowing the device to be formed as a monolithic structure with other semiconductor devices e.g., semiconductor lasers or light emitting diodes and integrated circuits. Such monolithic integration of components offers the advantages of low cost, compactness, reliability, high speed and good mechanical stability.

One embodiment which is exemplary of the novel device is described with reference to FIGS. 1–3. In accordance with FIG. 1, there is shown a plan view of a novel ridge-waveguide beam splitter integrated with a laser and a detector on a single semiconductor chip. Here, two ridge waveguides 1 and 2 which are orthogonal to each other are formed on a semiconductor substrate 3. As shown, they are oriented 90 degrees with respect to each other. In a preferred embodiment, the structure comprises three layers 4, 5 and 6 made of $Ga_{.90}Al_{.10}As/Ga_{.87}Al_{.13}As/Ga_{.90}Al_{.10}As$ heterostructures respectively which may be grown by Organo-Metallic Vapor Phase Epitaxy on a GaAs substrate 3. Ridges 7 and 8 formed from layer 4 of the waveguides have a width, w, of about 6 microns and a ridge height, h, of about 2.5 microns, and guiding layer 5 has a thickness, t, of about 3.7 microns. At the center of the waveguide intersection, a groove 9 is oriented, for example, at a 45 degree angle with respect to the waveguide axes and extends across the intersection. The bottom of the groove 9 penetrates partially into the guiding layer 5 as shown in FIG. 3. The walls of the groove 9 must be smooth with a mirror-like surface and the width of the groove 9 is necessarily narrow, e.g., less than 0.5 micron.

The beam splitter operates as follows: a wave travelling from port 1 to port 2 in FIG. 1 will be partially reflected at the intersection by the groove 9 toward port 3, and partially transmitted to port 2. Similarly, a wave travelling from port 4 will be partially reflected by the groove 9 toward port 2 and partially transmitted to port 3. By varying the depth of the groove 9, the beam splitting ratio can be changed. The advantage of this design over conventional directional couplers is that it is extremely small and suitable for monolithic integration with photonic and electronic devices. FIG. 1 depicts such integration with a photonic device wherein regions 10 and 11 of the semiconductor on which the ridge waveguide structure is formed are lasers capable of emitting photons into input ports 1 and 4 at a wavelength that can be supported by the ridge waveguide and regions 12 and 13 are formed so as to provide a detector for light emitted at output ports 2 and 3. The structure of semiconductor lasers and detectors is well known in the art.

The waveguide ridges may be formed by an isotropic wet chemical etch. The fabrication of the narrow groove 9 is preferably achieved with dry etch techniques. For example, the groove 9 may be formed by maskless focused ion beam milling as is known in the art. Alternatively, the groove can be made by reactive ion etching using a mask patterned by a direct writing electron beam. Using a device made by the first method, I have observed the transmitted beam at both cleaved output ports (port 2 and port 3). The attenuation of the straight ridge waveguide alone made of a similar heterostructure was measured to be approximately 4 dB/cm.

Figure 4:
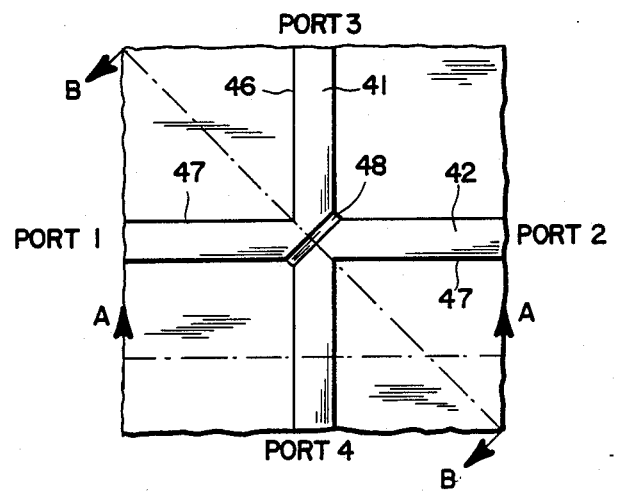
FIG. 4 is a partial top elevational view of another embodiment of a ridge waveguide beam splitter in accordance with the invention.
Figure 5:
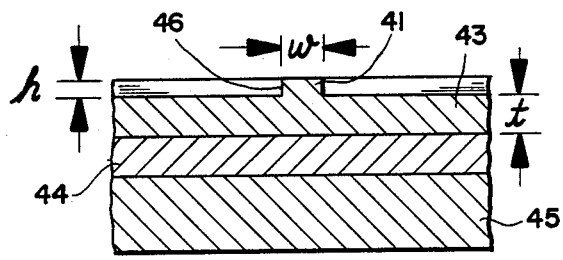
FIG. 5 is a cross sectional view of the device shown in FIG. 4 taken through plane A—A.
Figure 6:
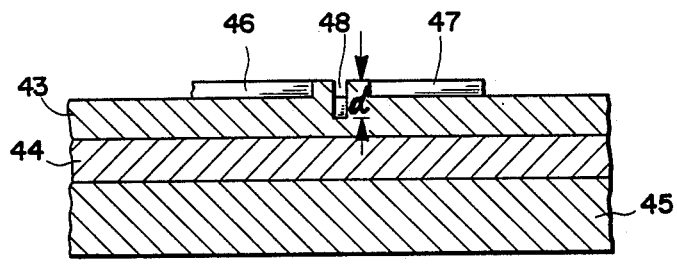
FIG. 6 is a cross sectional view of the device shown in FIG. 4 taken through plane B—B.

FIGS. 4–6 show another embodiment of the invention. In accordance with this embodiment a pair of orthogonal ridge waveguides 41 and 42 comprises a layer 43 of InGaAsP over an InP layer 44 on an InP substrate 45. The layer 43 is formed so as to provide orthogonal ridges 46 and 47. In this embodiment, the typical width, w, of the ridges are from 2–4 microns with a typical ridge height, h, of 0.05 to 0.1 micron. The thickness, t, of the waveguide layer 43, is in the order of 1 micron. As with the previously described embodiment, a groove 46 is formed at and extending across the intersection of the waveguides 41 and 42. The depth of the groove is such that it partially penetrates the waveguide layer 43. The walls of the groove 48 must be smooth with a mirror-like surface.

Figure 2:
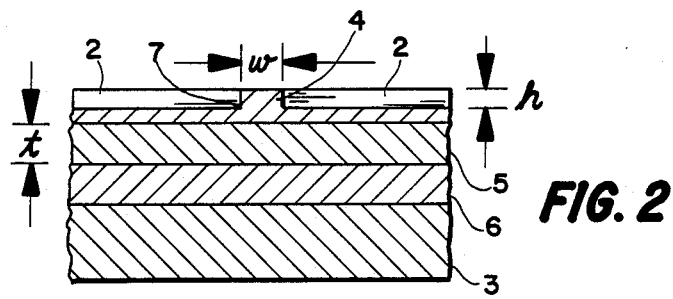
FIG. 2 is a partial cross sectional view of the device shown in FIG. 1 taken through plane A—A.
Figure 3:
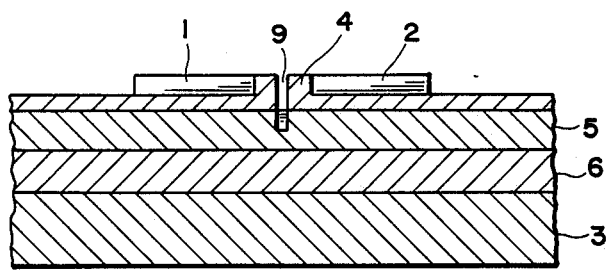
FIG. 3 is a cross sectional view of the waveguide portion of the device shown in FIG. 1 taken through plane B—B.

The principle of operation is the same as the three layer waveguide structure shown in FIGS. 1–3.

It should be understood that the embodiments shown herein are merely exemplary of the invention and the invention is not limited to the particular materials and/or dimensions as described herein. Those skilled in the art will appreciate the fact that other heterostructures may be employed making use of the teachings herein. It should be further understood that the present invention may be employed in either a multimode or a single mode waveguide.

What is claimed is:

1. A monolithic semiconductor device comprising a ridge waveguide beam splitter comprising a substrate, a pair of intersecting waveguides on said substrate, each of said waveguides having a ridge and a waveguide guiding layer below said ridge with a narrow groove extending through said ridge and into said guiding layer at the intersection of said waveguides, said groove being at an angle of 45° to said orthogonal waveguides, extending across the intersection of said waveguides, and having smooth, mirror-like surfaces.

2. The device recited in claim 1 wherein said beam splitter is formed on and integrated with a photonic or electronic semiconductor device.

3. The device recited in claim 1 wherein said waveguides comprise at least one input port and at least one output port and said device further comprises a light source coupled to said input port and a light detector coupled to said output port.

4. The device recited in claim 1 wherein said substrate is selected from the group consisting of GaAs and InP and when said substrate is GaAs said guiding layer is a GaAlAs compound and when said substrate is InP said guiding layer is a GaInAsP compound.

* * * * *